(12) United States Patent
Huang et al.

(10) Patent No.: US 10,790,418 B2
(45) Date of Patent: Sep. 29, 2020

(54) LIGHT EMITTING DIODE FABRICATION METHOD

(71) Applicant: XIAMEN SANAN OPTOELECTRONICS TECHNOLOGY CO., LTD., Xiamen (CN)

(72) Inventors: Yi-Jui Huang, Xiamen (CN); Kechuang Lin, Xiamen (CN); Suhui Lin, Xiamen (CN); Jiali Zhuo, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/588,395

(22) Filed: Dec. 31, 2014

(65) Prior Publication Data

US 2015/0111328 A1 Apr. 23, 2015

Related U.S. Application Data

(63) Continuation of application No. PCT/CN2013/087178, filed on Nov. 15, 2013.

(30) Foreign Application Priority Data

Nov. 23, 2012 (CN) .......................... 2012 1 0481055

(51) Int. Cl.
*H01L 33/50* (2010.01)
*H01L 33/54* (2010.01)

(52) U.S. Cl.
CPC ............ *H01L 33/507* (2013.01); *H01L 33/50* (2013.01); *H01L 33/54* (2013.01); *H01L 2933/005* (2013.01); *H01L 2933/0041* (2013.01)

(58) Field of Classification Search
CPC ........ H01L 33/507; H01L 33/54; H01L 33/50
See application file for complete search history.

(56) References Cited

U.S. PATENT DOCUMENTS

| | | | | |
|---|---|---|---|---|
| 5,801,432 A | * | 9/1998 | Rostoker | ............. H01L 23/3121 257/666 |
| 5,976,965 A | * | 11/1999 | Takahashi | ........... H01L 21/4853 228/180.22 |
| 6,592,420 B1 | * | 7/2003 | Onishi | ..................... H01J 9/227 118/53 |
| 7,049,159 B2 | * | 5/2006 | Lowery | ................. H01L 33/505 438/22 |

(Continued)

*Primary Examiner* — Dale E Page
*Assistant Examiner* — Quovaunda Jefferson
(74) *Attorney, Agent, or Firm* — Syncoda LLC; Feng Ma

(57) ABSTRACT

A fabrication method for a light emitting diode (LED), including: 1) mounting a LED chip on a substrate; 2) mounting a screen printing template on the LED chip; 3) coating a silicone gel layer over the surface of the screen printing template; 4) printing the phosphor: printing the phosphor over the chip surface via silk screen printing process and recycling the excess phosphor; and 5) removing the screen printing template and baking the phosphor for curing, and coating the cured phosphor over the chip surface. In the packaging method of the present disclosure, the unused phosphor can be recycled because it is not polluted by the screen printing template material.

9 Claims, 12 Drawing Sheets

(56) References Cited

U.S. PATENT DOCUMENTS

| | | | |
|---|---|---|---|
| 2003/0219992 A1* | 11/2003 | Schaper | B29C 33/52 |
| | | | 438/748 |
| 2007/0141739 A1* | 6/2007 | Thompson | C08J 3/243 |
| | | | 438/28 |
| 2010/0181582 A1* | 7/2010 | Li | H01L 33/44 |
| | | | 257/91 |
| 2010/0252845 A1* | 10/2010 | Lin | H01L 33/508 |
| | | | 257/98 |
| 2010/0295077 A1* | 11/2010 | Melman | H01L 33/50 |
| | | | 257/98 |
| 2011/0031523 A1* | 2/2011 | Ishii | C09K 11/7734 |
| | | | 257/98 |
| 2011/0284822 A1* | 11/2011 | Jung | H01L 33/56 |
| | | | 257/13 |
| 2014/0361325 A1* | 12/2014 | Li | H01L 33/507 |
| | | | 257/98 |

* cited by examiner

LIGHT EMITTING DIODE FABRICATION METHOD

CROSS-REFERENCE TO RELATED APPLICATIONS

The present application is a continuation of, and claims priority to, PCT/CN2013/087178, filed on Nov. 15, 2013, which claims priority to Chinese Patent Application No. CN 201210481055.X, filed on Nov. 23, 2012. The disclosures of the above applications are hereby incorporated by reference in their entirety.

BACKGROUND

In recent years, many improvements have been made on the LED luminance thanks to material and technology breakthroughs. In particular, with the emergence of the white light emitting diode (WLED), the LED has gradually replaced the existing traditional lighting equipment.

The white light can be generated via combination of red, green and blue LED chips, whose manufacturing technology is not yet mature. The existing mature WLED technology in the world is to coat the phosphor emitting yellow light on the blue light LED chip surface via mixture of the blue light and the yellow light.

Potting is the main traditional phosphor coating method, i.e., dispensing process of phosphor mixed gel. Coat a mixed layer of phosphor and gel on the LED chip. However, due to gravity and surface tension, the phosphor cannot be evenly coated, leading to unavoidable photochromic unevenness of different degrees in the products. In addition, the WLED yield cannot be improved due to limitation of the speed of the phosphor dispensing process. A new phosphor conformal coating concept is introduced, i.e., premixing the phosphor with the gel into the phosphor gel, and then evenly coating the phosphor gel on the front surface and side surfaces of the LED chip light-emitting layer via a screen. The phosphor layer can evenly coat various phosphor gels on the LED chip through the mature and simple screen printing technology. In comparison to traditional dispensing process, the light emitting evenness of the conformal coating is better and it is easier to control the phosphor layer thickness. In addition, this conformal process is suitable for large-scale integrated production. However, scrap irons are common during screen printing, which may pollute the phosphor, leading to undesirable effects as follows: (1) the possible electric leakage may influence the product yield; (2) the scrap irons in the phosphor may lead to light absorption and shading problems, which influence the luminous efficiency; and (3) the removed phosphor cannot be recycled, causing material waste.

SUMMARY

To solve the aforementioned problems of the current technologies, the present disclosure provides a new and improved phosphor conformal coating method on the basis of existing screen printing coating, which allows recycled use of phosphor after being mixed with the gel because the phosphor will not be polluted by the screen.

According to a first aspect of the present disclosure, a LED packaging method is provided, which includes the following steps: 1) selecting one screen printing template and coating a protection layer over the surface; 2) mounting a LED chip on the substrate; 3) mounting the screen printing template on the LED chip; 4) printing the phosphor: printing the phosphor over the chip surface via silk screen printing process and recycling the excess phosphor; and 5) removing the screen printing template and baking the phosphor for curing, and coating the cured phosphor over the chip surface.

In some embodiments, Step 4) specially includes the followings: mixing the phosphor with the gel into the phosphor gel; evenly coating the phosphor gel on the front surface and side surfaces of the LED chip light-emitting layer via a screen; and recycling excess phosphor. Further, the silicone gel in Step 2) is of the same model with the phosphor mixed gel.

In some embodiments, thickness of the protection layer in Step 1) is about 1-5000 μm.

In some embodiments, the screen printing template in Step 1 is steel plate or ceramic plate.

In some embodiments, Step 5) specially includes the followings: removing the screen printing template, baking the phosphor for curing and coating the cured phosphor over the chip surface.

In some embodiments, Step 5) specially includes the followings: baking the phosphor for curing, coating the cured phosphor over the chip surface, and separating the chip from the substrate.

According to a second aspect of the present disclosure, a LED packaging method is provided, which includes the following steps: 1) mounting a LED chip on the substrate; 2) mounting a screen printing template on the LED chip; 3) coating a protection layer over the surface of the screen printing template; 4) printing the phosphor: printing the phosphor over the chip surface via silk screen printing process and recycling the excess phosphor; and 5) removing the screen printing template and baking the phosphor for curing, and coating the cured phosphor over the chip surface.

In some embodiments, the protection layer in Step 3) is a silicone gel.

In some embodiments, Step 4) specially includes the followings: mixing the phosphor with the gel into the phosphor gel; evenly coating the phosphor gel on the front surface and side surfaces of the LED chip light-emitting layer via a screen; and recycling excess phosphor.

In some preferred embodiments, the silicon gel in Step 2) is of the same model with the phosphor mixed gel in Step 4).

In some embodiments, Step 5) specially includes the followings: removing the screen printing template, baking the phosphor for curing and coating the cured phosphor over the chip surface.

In some embodiments, Step 5) specially includes the followings: baking the phosphor for curing, coating the cured phosphor over the chip surface, and separating the chip from the substrate.

In the present disclosure, first, coat a protection layer over the screen printing template surface, which, in general, is a flexible plasticity material, protecting the surface layer of the screen printing template from being scrapped and polluting the phosphor during phosphor printing. Further, the protection layer material is preferably the same with the material (e.g., the silicone gel) to be mixed with the phosphor in following process. In this way, though the phosphor on the protection layer is scrapped down, it will not influence the luminous efficiency and luminance of the device because it is of the same material with the phosphor mix gel. In addition, the unused phosphor after screen printing can be recycled because it is not polluted by the screen printing template.

100, 200: LED chip;
110, 210: substrate;
120, 220: screen printing template;
121, 221: stencil zone of the screen printing template;
130, 230: silicone protection layer;
140, 240: phosphor gel;
300: squeegee blade.

DETAILED DESCRIPTION

Figure 1:
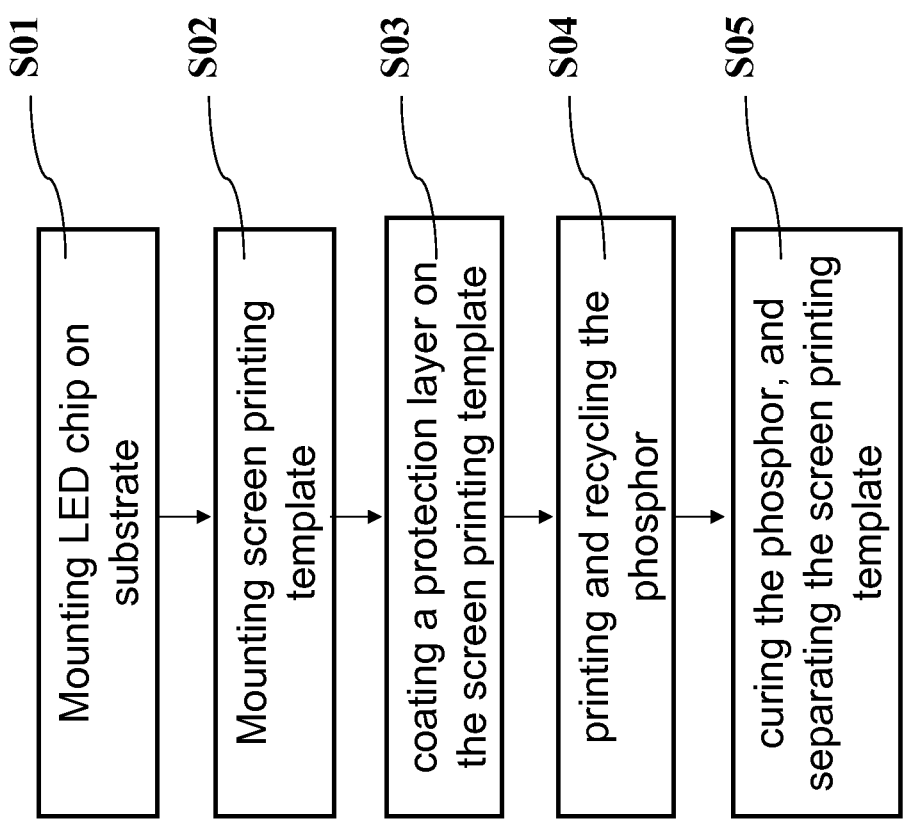
FIG. 1 is a flow diagram according to some embodiments of the present disclosure.
Figure 2:
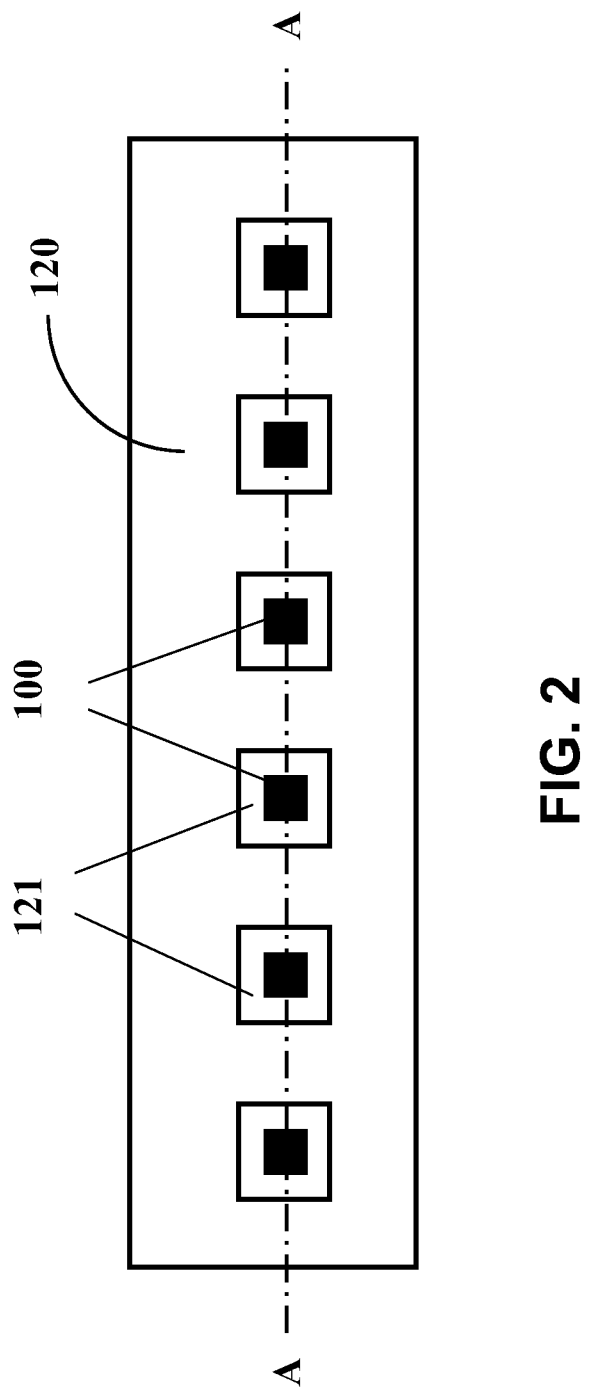
FIG. 2 illustrates a first step a LED packaging method according to Embodiment 1.
Figure 3:
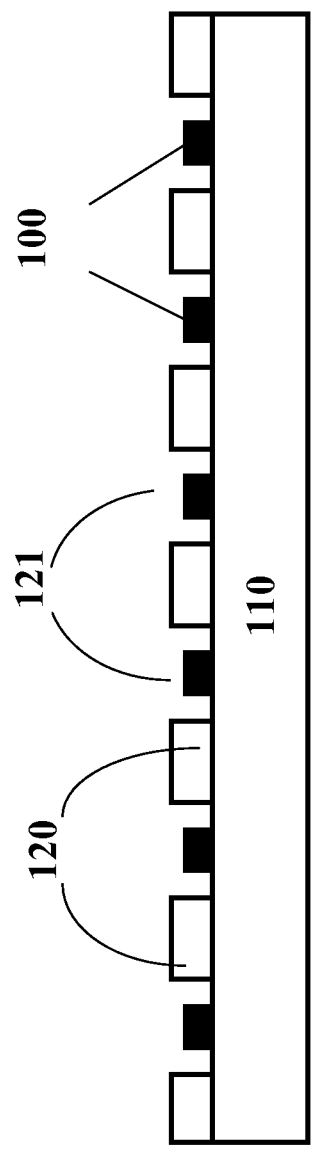
FIG. 3 illustrates a second step.
Figure 4:
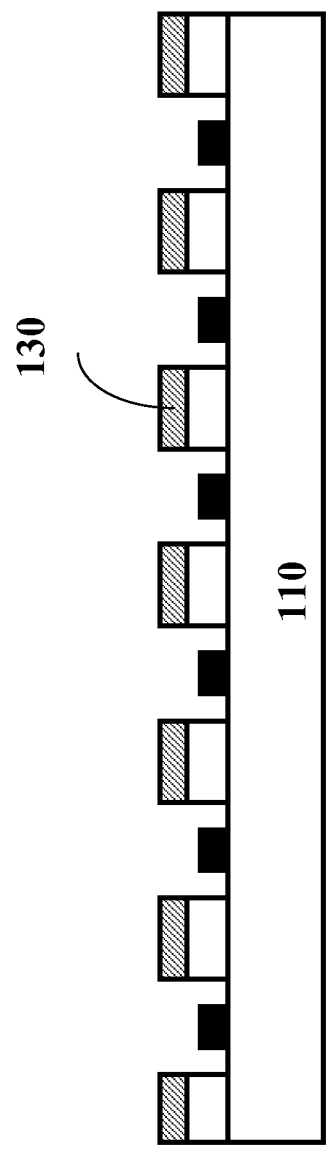
FIG. 4 illustrates a third step.
Figure 5:
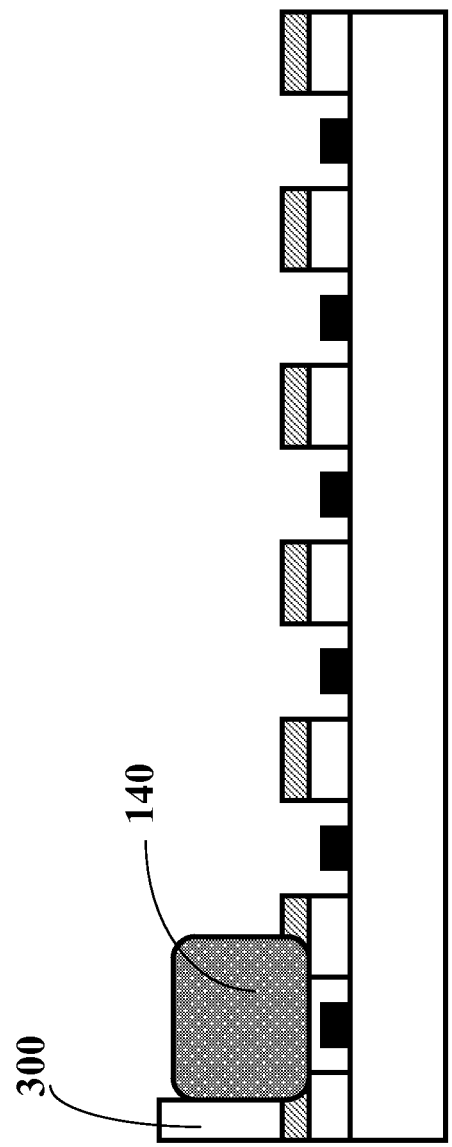
FIG. 5 illustrates a fourth step.
Figure 6:
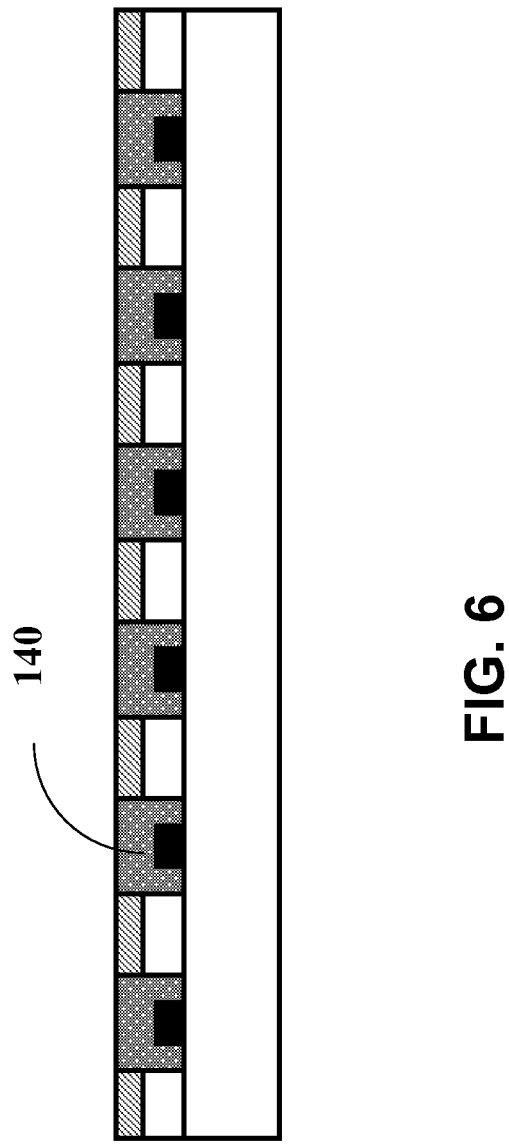
FIG. 6 illustrates a fifth step.
Figure 7:
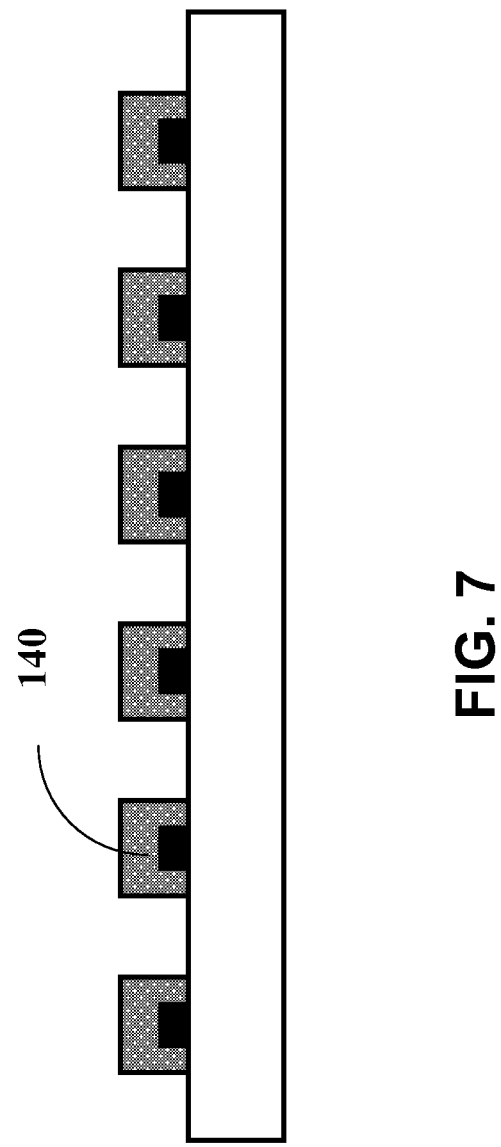
FIG. 7 illustrates a sixth step.
Figure 8:
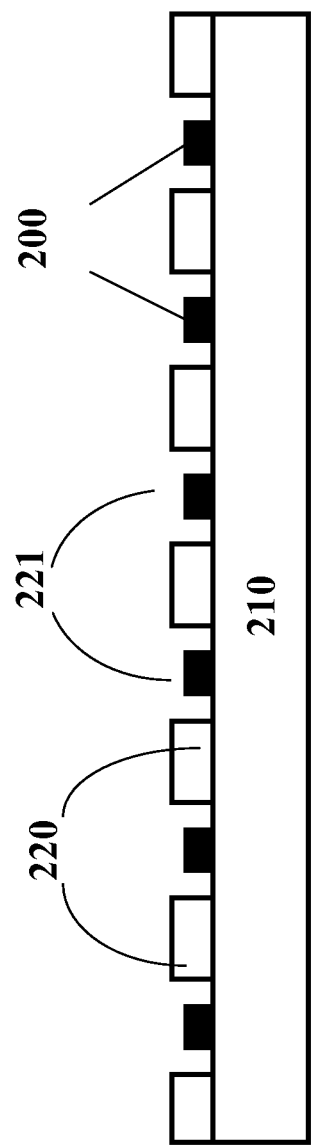
FIG. 8 illustrates a first step of a LED packaging method according to Embodiment 2.

The embodiments below disclose a LED packaging method with recyclable phosphor. The flow diagram as shown in FIG. 1 mainly includes Step S01: mounting a LED chip on a substrate; S02: mounting a screen printing template; S03: coating a protection layer on the screen printing template; S04: printing and recycling the phosphor; and S05: curing the phosphor, and separating the screen printing template.

In Step S01, for single LED chip grain, first place the separated LED chips on special clamp fixture, metal foil or other carrying devices or tools. The metal foil can be Au, Ag, Cu, Al or their combination. The LED tub can be mounted on the PCB board.

Before Step S02, first fabricate the screen printing template for printing purpose. The screen printing template material can be metal (e.g., stainless steel) or plastic. In general, the screen printing template can be divided into a stencil zone and a shielding zone. When the phosphor gel is coated over the stencil zone, the phosphor gel can pass through the screen printing template and fill into the space below to engage in the LED chip. The shielding zone blocks the phosphor gel from passing through. The preset exposed LED surface (e.g., electrode) will not clad the phosphor gel, enabling normal operation of following finishing processes (e.g., wire bonding, electrode connection). At the same time, the patterns of the stencil zone and the shielding zone on the screen printing template can be varied to adjust the yellow light ratio converted from the light emitted from the LED chip into the phosphor gel, so as to adjust the white light composition and color temperature.

In Step S03, the protection layer material, in general, is a flexible plasticity material, and is preferably the same with the material to be mixed with the phosphor in following process. In this way, though the phosphor on the protection layer is scrapped down, it will not influence the luminous efficiency and luminance of the device for it is of the same material with the phosphor mix gel. The thickness of the protection layer, in general, is about 1-5000 μm. It should be noted that the protection layer material can also be different mixture materials with translucency.

Step S02 and Step S03 can be switched, i.e., first coating the protection layer on the screen printing template and then mounting it on the substrate, depending on the specific application.

In Step S04, the screen printing processes can be blade coating, spray coating, roller coating and print coating.

In Step S05, if the LED chip is directly mounted on the carrying device (e.g., the PCB board) of the light-emitting device, in general, remove the screen printing template from the carrying device and the protection layer is thinner (for example, about 1-500 μm); if the LED chip is mounted on the temporary carrying device (e.g., the special clamp fixture), after screen printing and curing of phosphor, use the chip grain extraction device to extract the chip from the temporary carrying device. Therefore, the temporary carrying device mounted with the screen printing template can be recycled for further use. In this case, the protection layer is thicker (for example, about 500-5000 μm).

Embodiment 1

In this embodiment, the screen printing steel plate is selected as the screen printing template and the silicon gel as the protection layer. As shown in FIGS. 2-7, first, mount the separated LED chip 100 on the substrate 110 by order and expand the screen printing steel plate 120 on the substrate; next, coat a layer of silicon gel 130 evenly over the surface of screen printing steel plate 120 (thickness: about 50 μm); next, place the phosphor gel 140 pre-mixed with the phosphor on the screen printing steel plate 120 and use the squeegee blade 300 with appropriate force to push the phosphor gel forth and back. The phosphor gel 140 is pushed into the space 121 below the screen printing template and fills up the space below the substrate, the LED chip and the screen printing steel plate. The unused phosphor mix gel is not mixed with impurities like scrap irons thanks to protection of the silicon gel layer 110 and therefore can be recycled. Take off the screen printing steel plate 110 and bake the phosphor gel 140 for curing. Last, finish the following packaging processing to complete the packaging process.

Embodiment 2

Figure 9:
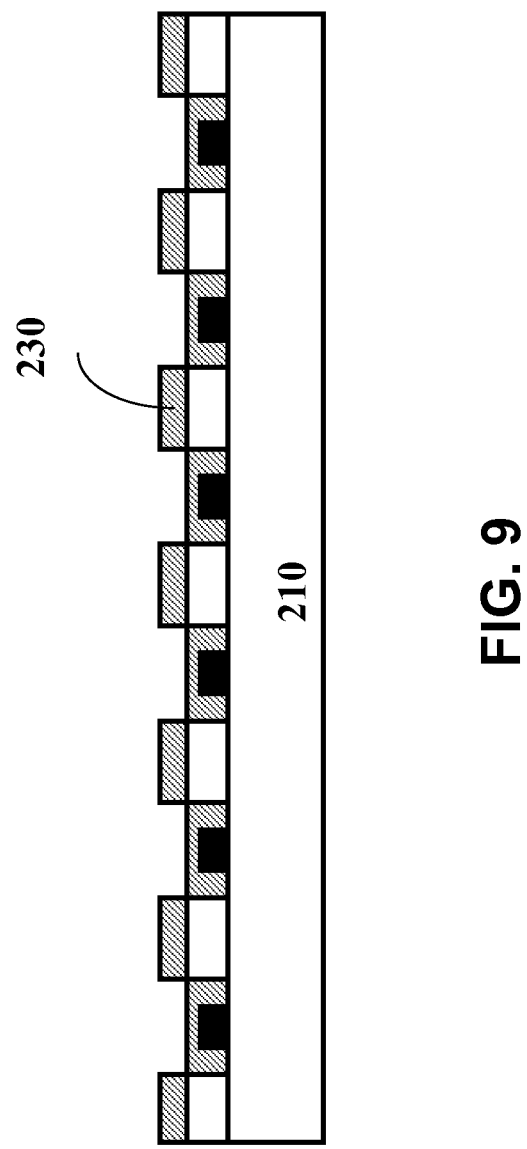
FIG. 9 illustrates a second step.
Figure 10:
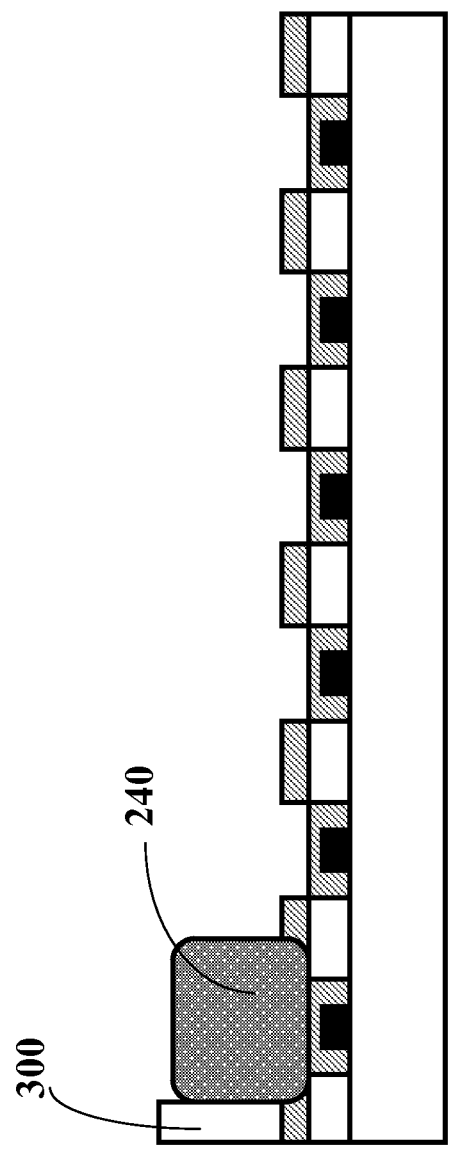
FIG. 10 illustrates a third step.
Figure 11:
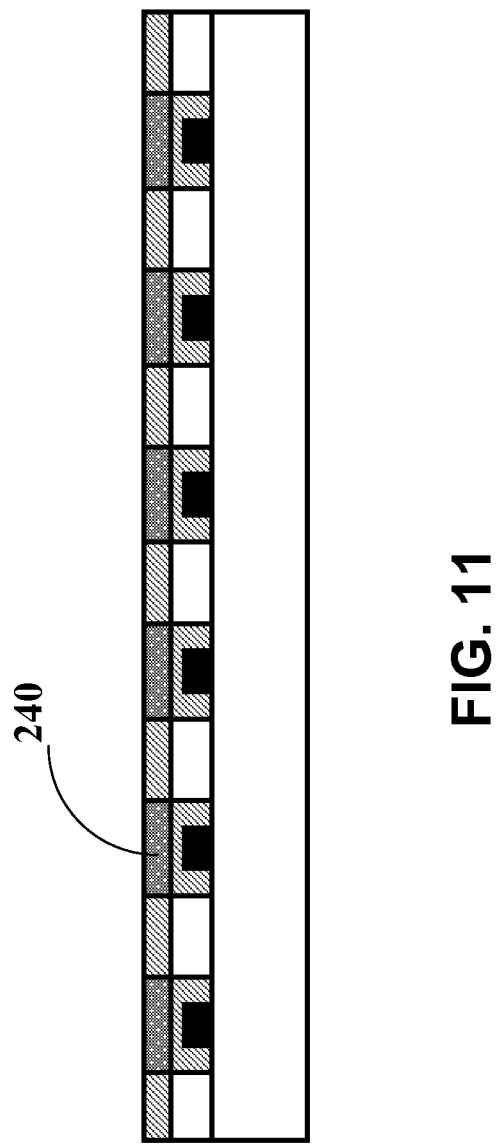
FIG. 11 illustrates a fourth step.
Figure 12:
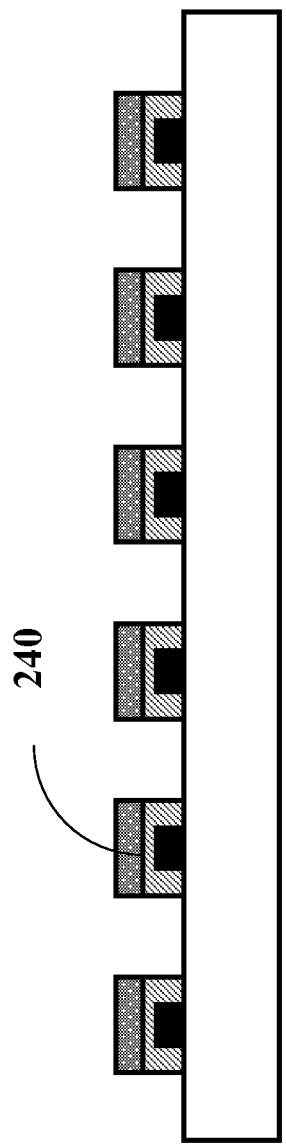
FIG. 12 illustrates a fifth step.

With reference to FIGS. 8-12, different from Embodiment 1, in Step 3 of this embodiment, the silicone protection layer also covers over the chip surface (as shown in FIG. 9). Therefore, the chip surface is not directly in contact with the phosphor. This is referred to as the "Remote-Phosphor," which effectively eliminates low efficiency of the phosphor due to heat and is beneficial for optical lighting pattern application and improvement of heat dissipation.

Embodiment 3

The differences between this embodiment and Embodiment 1 may include: prior to mounting the screen printing steel plate on the substrate, coat the protection layer to simplify coating process of the protection layer.

In Embodiments 1-3, the LED chip is mounted on the substrate (e.g., the PCB board). After the phosphor coating, remove the screen printing template and last obtain the light-emitting devices like LED tube coordination with optical element, circuit design and heat dissipation device.

Embodiment 4

Different from Embodiment 1 and Embodiment 3, in this embodiment, the LED chip is mounted on a special clamp fixture. Through the aforesaid screen printing coating process, coat the phosphor over the chip surface and then extract the chip from the clamp fixture via chip grain extraction device (e.g., sorting machine). The thickness of the protection layer is about 1000 μm. In this way, the LED chip can be continually and directly mounted on the clamp fixture without repeating mounting of the screen printing template.

The invention claimed is:

1. A fabrication method for a light-emitting diode (LED), comprising:
   Step 1) selecting a screen printing template and coating a protection layer over a surface of the screen printing template;
   Step 2) mounting an LED chip on a substrate;
   Step 3) mounting the screen printing template on the LED chip and covering a front surface and side surfaces of the LED chip with the protection layer;
   Step 4) printing a phosphor over the protection layer of the LED chip via a screen printing process by pushing the phosphor with a squeegee blade, to thereby form a remote-phosphor configuration such that heat dissipation and phosphor efficiency are improved resulting from the surface of the LED chip not directly in contact with the phosphor, wherein the phosphor is located only on the front surface of protection layer; and
   Step 5) baking the phosphor for curing and separating the LED chip from the screen printing template,
   wherein the Step 4) comprises:
   mixing the phosphor with a gel into a phosphor gel;
   evenly coating the phosphor gel over the protection layer via the screen printing template; and
   recycling excess phosphor;
   wherein a material of the protection layer is same with a material of the gel such that accidentally-scraped down material of the protection layer mixed with the gel does not cause contamination to the excess phosphor being recycled and
   wherein the Step 5) comprises baking the phosphor for curing, coating the cured phosphor over the protection layer that is over the surface of the chip, and separating the chip from the substrate.

2. The fabrication method of claim 1, wherein a thickness of the protection layer is about 1 - 5000 μm.

3. The fabrication method of claim 1, wherein the Step 5) further comprises removing the screen printing template.

4. A fabrication method for a light-emitting diode (LED), comprising:
   Step 1) mounting a LED chip on a substrate;
   Step 2) mounting a screen printing template on the LED chip;
   Step 3) coating a protection layer over surface of the screen printing template and a surface of the LED chip;
   Step 4) printing a phosphor over the protection layer the LED chip via a screen printing process by pushing the phosphor with a squeegee blade, and recycling excess phosphor, to thereby form a remote-phosphor configuration such that heat dissipation and phosphor efficiency are improved resulting from the surface of the LED chip not directly in contact with the phosphor, wherein the phosphor is located only on the front surface of protection layer; and
   Step 5) baking the phosphor for curing and separating the LED chip from the screen printing template,
   the method further comprising adjusting patterns on the screen printing template to thereby adjust white light composition and color temperature from the resulting LED chip;
   wherein the protective layer is composed of a material selected such that the material accidentally scraped down and mixed with the phosphor does not substantially affect a luminous efficiency and a luminance of the LED to be fabricated.

5. The fabrication method of claim 4, wherein the Step 4) comprises:
   mixing the phosphor with a gel into a phosphor gel;
   evenly coating the phosphor gel on the protection layer that is over a front surface and side surfaces of light-emitting layer of the LED chip via the screen printing template.

6. The fabrication method of claim 5, wherein a thickness of the protection layer in Step 3) is about 1 - 5000 μm.

7. The fabrication method of claim 4, wherein the Step 5) further comprises removing the screen printing template.

8. The fabrication method of claim 4, wherein the screen printing template is a steel plate.

9. The fabrication method of claim 4, wherein the screen printing template is a ceramic plate.

* * * * *